United States Patent [19]

Hall

[11] Patent Number: 5,097,491

[45] Date of Patent: Mar. 17, 1992

[54] MODULAR GRAY CODE COUNTER

[75] Inventor: Christopher M. Hall, Redwood City, Calif.

[73] Assignee: National Semiconductor Corporation, Santa Clara, Calif.

[21] Appl. No.: 531,004

[22] Filed: May 31, 1990

[51] Int. Cl.$^5$ .............................................. H03K 23/40
[52] U.S. Cl. ........................................ 377/34; 377/45; 377/106
[58] Field of Search .................... 377/34, 45, 125, 106

[56] References Cited

U.S. PATENT DOCUMENTS

| | | | |
|---|---|---|---|
| 3,349,332 | 10/1967 | Bleickardt | 377/34 |
| 3,515,341 | 6/1970 | Frick | 377/34 |
| 3,588,461 | 6/1971 | Haisall | 377/34 |
| 4,264,807 | 4/1981 | Moen et al. | 377/34 |
| 4,408,336 | 10/1983 | Das Gupta | 377/34 |
| 4,618,849 | 10/1986 | Bruestle | 377/44 |
| 4,780,894 | 10/1988 | Watkins et al. | 377/34 |
| 4,937,845 | 6/1990 | Warner | 377/34 |

FOREIGN PATENT DOCUMENTS

| | | |
|---|---|---|
| 1265993 | 10/1986 | U.S.S.R. |
| 1418686 | 8/1988 | U.S.S.R. |
| 1271541 | 4/1972 | United Kingdom |

OTHER PUBLICATIONS

D. E. Popp & J. C. Vermeulen, "Gray Code Counter Design Based on Parity Monitoring," IBM Technical Disclosure Bulletin, vol. 21, No. 5, Oct. 1978, pp. 1778-1881.

A. I. Gonchar, V. S. Nesterenko & V. A. Fazkullin, "Gray Code Bidirectional Counter," Translation from Pribory i Tekhnika Eksperimenta, No. 5, pp. 86-87, Sep.-Oct. 1982 (pp. 1135-1136).

J. C. Majithia, "Simple Design for Up/Down Gray Code Counters," Electronics Letters, Nov. 4, 1971, vol. 7, No. 22, pp. 658-659.

M. Ermann, "Contadores codigo Gray", [Gray Code Counters], Revista Telegrafica Electronica, Nov. 1976, pp. 690-692, 707 & 711.

B. C. Kim, "A Study on the Gray Code Digit Sequence," J. Korean Inst. Electron. Eng., vol. 12, No. 5, pp. 6-11, Dec. 1975.

J. Hlavaty & M. L. Kolesar, "Realizacie Pocitaca Impulzov v Grayovom kode s integrovanymi obvodmi" [Realization of Pulse Counters in the Gray Code with Integrated Circuits], Sdelovaci technika, Oct. 1972, pp. 375-378.

G. A. Maley, "Gray Code Counter," IBM Technical Disclosure Bulletin, vol. 13, No. 4, Sep. 1970, p. 824.

J. W. Barrs & J. C. Leininger, "Modified Gray Code Counters," IBM Technical Disclosure Bulletin, vol. 23, No. 2, Jul. 1980, pp. 460-462.

M. V. Chkheidze et al., "Counters in Grey Code," pp. 252-262 [translation from Kibernetiku-Na Sluzhbu Kommunizmu, vol. 3, pp. 206-214].

"Elements of Cybernetic Systems (Selected Articles)," Academy of Sciences of Georgian Soviet Socialist Republic, United States Air Force Translation FTD-M-T-66-61.

*Primary Examiner*—John S. Heyman
*Attorney, Agent, or Firm*—Limbach, Limbach & Sutton

[57] ABSTRACT

A Gray Code counter is provided having synchronous, modular circuits for each of the three types of bit positions, i.e., least significant bit ("LSB"), most significant bit ("MSB") and middle bit ("MB"). One LSB and MSB circuit each are used with as many MB circuits in between as are necessary to provide a counter having the desired number of bits. The LSB, MSB and MB circuits' designs are truly modular in that duplicate MB circuits can be freely coupled together between an LSB circuit and an MSB circuit to provide the desired number of counter bits without modifying any input or output interfaces between the circuits. The counter can count either up or down in accordance with a normal Gray Code sequence.

35 Claims, 5 Drawing Sheets

MODULAR GRAY CODE COUNTER

BACKGROUND OF THE INVENTION

1. Field of the Invention

The present invention relates to binary counter circuits, and in particular, to Gray Code counter circuits.

2. Description of the Related Art

Binary counters are used in virtually every digital computer or programmable controller, as well as many other types of digital systems. Many binary counters count sequentially, up or down, in accordance with a normal binary sequence. However, counting in a normal binary sequence results in bit pattern changes having multiple bit transitions. With multiple bits all experiencing logical transitions at one time, a binary counter can experience transition errors, e.g., "glitches," and produce electrical noise, thereby causing interference within the host system.

To overcome these problems, Gray Code counters are often used. Gray Code counters have the advantage of producing only one bit transition from one count to the next, thereby producing a virtually glitch-free count sequence.

However, Gray Code counters have problems of their own. Unlike binary counters, whose individual bit transitions are dependent only upon the logical states of their immediately adjacent bits, a Gray Code counter's individual bit transitions are dependent upon the logical state of all other bits within the counter. This has resulted in complex logic and circuit designs based upon complex logic equations representing the expressions or states of the counter required to define the counting sequence. Such complexity increases greatly as more bits are added, i.e., for longer count sequences. Furthermore, the complexity is exacerbated for Gray Counters designed to provide both up and down counting, i.e., incrementing and decrementing count sequences.

The complexity of Gray Code counters has been caused by the interdependency of the individual counter bits' transitions upon the logical states of all the other counter bits. Such interdependency has produced designs having interconnections for feedback and feedforward paths coupling to or across multiple counter stages. This causes the interconnections to differ from one stage to the next.

Many Gray Code counter designs use clock signals for the individual counter stages which are not fully synchronous. These asynchronous counters use various means for gating the counter stages clock signals. Other Gray Code counters have been designed to operate completely asynchronously with no clock signal per se. Instead, these Gray Code counters operate as ripple counters.

A Gray Code counter's interstage connections are further affected when the counter is designed to provide both incrementing and decrementing count sequences. In this case, several, if not most, counter stages must usually be interconnected.

The inter-bit dependence of Gray Code counters has resulted in counter designs which tend to be unique to each particular application, and must generally be redesigned whenever a bit or bits are to be added to or removed from the count sequence. Such redesign has been further necessitated when it is desired that the Gray Code counter selectively increment or decrement during its count sequence.

Furthermore, the inter-bit dependence of Gray Code counters has caused this uniqueness of design to extend all the way down to the individual counter stages. The interfaces among the counter stages, including the clock signals, vary from one counter stage to the next. As a result, prior art Gray Code counter designs have been either non-modular or non-synchronous, or both.

Thus, it would be desirable to have a Gray Code counter design which is modular so that bits may be simply added to or removed from the count sequence by merely adding or removing counter stage modules without affecting the respective interfaces among the remaining counter stages. It would be further desirable to have such a Gray Code counter design which is also fully synchronous. It would be still further desirable to have such a synchronous, modular Gray Code counter design which can be selectively programmed to count up or down, i.e., increment or decrement during its count sequence.

SUMMARY OF THE INVENTION

The present invention provides fully modular circuit designs for each of the three types of counter stages, i.e., for the least significant bit, the most significant bit and the middle bits. Additional bits can be added to the Gray Code counter's sequence by merely adding counter stages corresponding to the middle bit counter stage. Similarly, the count sequence can be shortened by merely deleting middle bit counter stages. Such additions or deletions of middle bit counter stages have no effect upon the respective interfaces of any of the individual counter stages.

The present invention further provides a modular Gray Code counter which is fully synchronous. A single clock signal is used to directly clock every stage of the counter with no conditions or gating.

The present invention still further provides a synchronous, modular Gray Code counter which can be selectively programmed to increment or decrement. A single-bit count control signal is used to program the Gray Code counter to count up or down. The counter stage corresponding to the most significant bit is the only stage affected by this count control signal.

Thus, a Gray Code counter in accordance with the present invention provides a synchronous, fully modular Gray Code counter capable of selectively counting up or down and having interstage interfaces unaffected by the number of bits in the count sequence.

These and other objectives, features and advantages of the present invention will be readily understood upon consideration of the following detailed description of the invention and the accompanying drawings.

BRIEF DESCRIPTION OF THE DRAWINGS

FIG. 1 illustrates the present invention in simplified, functional block diagram form.

FIG. 2 illustrates in simplified, functional block diagram form the counter stage of the present invention for the least significant bit.

FIG. 3 illustrates in simplified, functional block diagram form the counter stage of the present invention for the most significant bit.

FIG. 4 illustrates in simplified, functional block diagram form the counter stage of the present invention for each of the middle bits.

FIG. 5 illustrates in simplified, logic diagram form a D-type master-slave flip-flop used in the counter stages of the present invention.

FIG. 6 illustrates in simplified, logic diagram form a logic signal selector circuit used in the counter stages of the present invention.

FIG. 7 illustrates in simplified, functional block and logic diagram form an alternative counter stage of the present invention for the most significant bit.

DETAILED DESCRIPTION OF THE INVENTION

Figure 1:
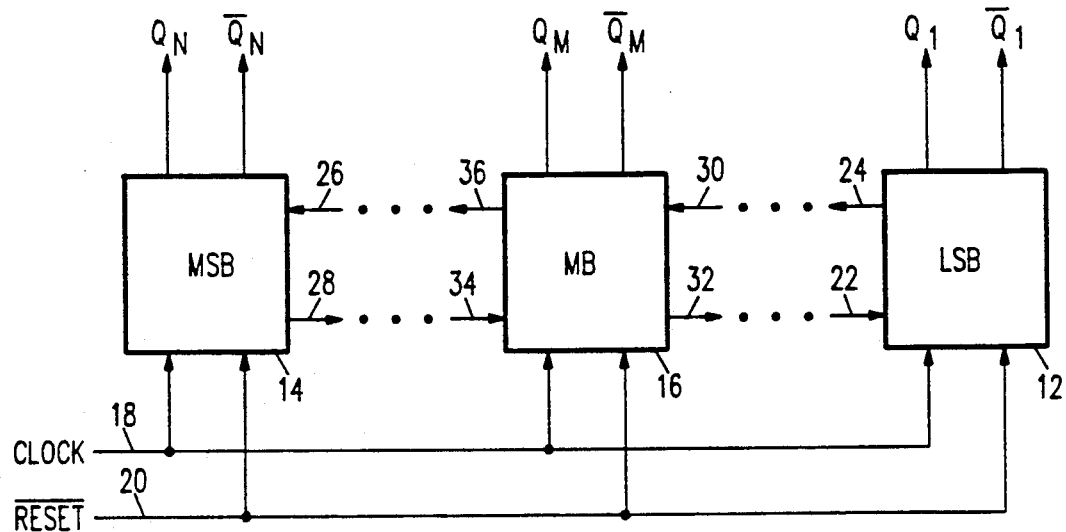
FIGS. 1-7 illustrate a Gray Code counter or portions thereof in accordance with the present invention. Throughout the figures, corresponding elements therein are designated with like numerals.

Referring to FIG. 1, a Gray Code counter 10 in accordance with the present invention comprises three types of counter stages. The first counter stage 12 contains the logic for producing the least significant bit $Q_1$ of the Gray Code count sequence. The last stage 14 contains the logic for producing the most significant bit $Q_N$ of the Gray Code count sequence (where N is the number of bits in the Gray Code counter sequence). The third type of counter stage 16 produces a middle bit $Q_N$ of the Gray Code count sequence. This middle stage 16 is duplicated N-2 times as needed to produce the desired number N of bits.

The present invention has a binary count sequence which appears as follows (for the case of four bits):

| Decimal | Binary (Gray Code) | | | |
|---|---|---|---|---|
| 0 | 0 | 0 | 0 | 0 |
| 1 | 0 | 0 | 0 | 1 |
| 2 | 0 | 0 | 1 | 1 |
| 3 | 0 | 0 | 1 | 0 |
| 4 | 0 | 1 | 1 | 0 |
| 5 | 0 | 1 | 1 | 1 |
| 6 | 0 | 1 | 0 | 1 |
| 7 | 0 | 1 | 0 | 0 |
| 8 | 1 | 1 | 0 | 0 |
| 9 | 1 | 1 | 0 | 1 |
| 10 | 1 | 1 | 1 | 1 |
| 11 | 1 | 1 | 1 | 0 |
| 12 | 1 | 0 | 1 | 0 |
| 13 | 1 | 0 | 1 | 1 |
| 14 | 1 | 0 | 0 | 1 |
| 15 | 1 | 0 | 0 | 0 |

For Gray Code count sequences longer than four bits the patterns of bit transitions from one count to the next as shown above repeat themselves. More specifically, the least significant bit ("LSB") stage 12 outputs a bit making the parity odd for itself and all more significant bits. As is known in the art, "parity" is a common form of error detection code. A parity bit is typically an extra binary bit included with a binary message to make the total number of logical ones therein either even (including zero, i.e., none) or odd.

The most significant bit ("MSB") stage 14 outputs a logical zero when all less significant bits are all logical zeros, and outputs a logical one when the immediately less significant bit is a logical one and all other less significant bits are all logical zeros. For all other logical states of less significant bits the MSB stage 14 output remains unchanged.

The middle bit ("MB") stage 16 output changes its logical state making the parity odd for itself and all more significant bits when the immediately less significant bit is a logical one and all other less significant bits are all logical zeros. For all other logical states of less significant bits the MB stage 16 output remains unchanged.

Each of these stages 12, 14, 16 receives a clock signal 18 and a reset signal 20. In a preferred embodiment of the present invention, the reset signal 20 is active low. Further, as discussed more fully below, the clock signal 18 for the present invention comprises an active high signal and its inverse, an active low signal.

As discussed above, the value of each bit in a Gray Code counter is dependent upon the values of all other bits in the counter. Therefore, input and output interface signals are required to and from, respectively, each of the stages 12, 14, 16 in the Gray Code counter 10.

As discussed more fully below, the LSB stage 12 receives an input interface signal 22 and provides output interface signals 24. Similarly, the MSB stage 14 receives input interface signals 26 and provides an output interface signal 28.

The interface signals for the MB stage 16 interact with the counter stages for the immediately less significant bit $Q_{N-1}$ and for the immediately more significant bit $Q_{N+1}$. For interfacing with the counter stage for the immediately less significant bit $Q_{N-1}$, the MB stage 16 receives input interface signals 30 and provides an output interface signal 32. For interfacing with the counter stage for the immediately more significant bit $Q_{N+1}$, the MB stage 16 receives an input interface signal 34 and provides output interface signals 36.

Figure 2:
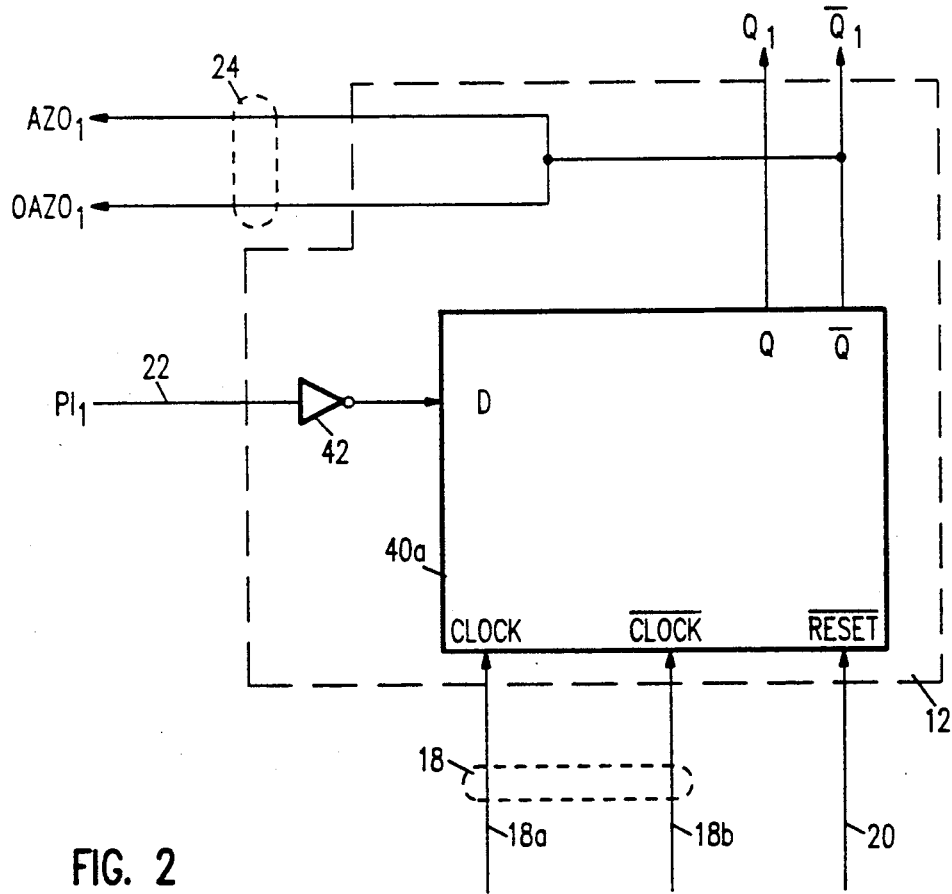

Referring to FIG. 2, the LSB stage 12 comprises a D-type flip-flop 40a and an inverter 42. In a preferred embodiment of the LSB stage 12 of a Gray Code counter 10 in accordance with the present invention, the D-type flip-flop 40a is a master-slave flip-flop (discussed below with respect to FIG. 5). Therefore, the clock signal 18 comprises an active high portion 18a and an active low portion 18b.

The Q and $\overline{Q}$ outputs of the flip-flop 40a provide the least significant bit $Q_1$ and its inverse $\overline{Q}_1$. The $\overline{Q}$ output is used to provide the output interface signals 24 for the LSB stage 12. The D-input, via the inverter 42, receives the input interface signal 22.

The LSB stage 12 of the Gray Code counter 10 operates in such a way as to make the parity odd for all of the more significant bits and the least significant bit $Q_1$. Toward this end, the D-input of the flip-flop 40a, via the inverter 42, receives the input interface signal 22 which is a "parity input" signal $PI_1$ representing the parity status of the more significant bits (discussed more fully below).

The inverse $\overline{Q}_1$ of the least significant bit $Q_1$ is used as the output interface signals 24 which comprise an "all zeros output" signal $AZO_1$, which is active high, and a "one and all zeros output" signal $OAZO_1$, which is active low.

Similar to the discussions below for the MSB stage 14 and MB stage 16, an "all zeros output" signal is intended to indicate whether all of the less significant bits are all logical zeros, and a "one and all zeros output" signal is intended to indicate whether the immediately less significant bit is a logical one and all other less significant bits are all logical zeros. However, since in the case of the LSB stage 12 there are no bits less significant than its own, i.e., the least significant bit $Q_1$, both the all zeros output signal $AZO_1$ and the one and all zeros output signal $OAZO_1$ each simply comprise the inverse $\overline{Q}_1$ of the least significant bit $Q_1$.

As discussed above, the input interface signal 22, i.e., the parity input signal $PI_1$, is received from an MB counter stage 16. Similarly, the output interface signals 24, i.e., the all zeros output signal $AZO_1$ and one and all zeros output signal $OAZO_1$, are provided to the same MB counter stage 16.

Figure 3:
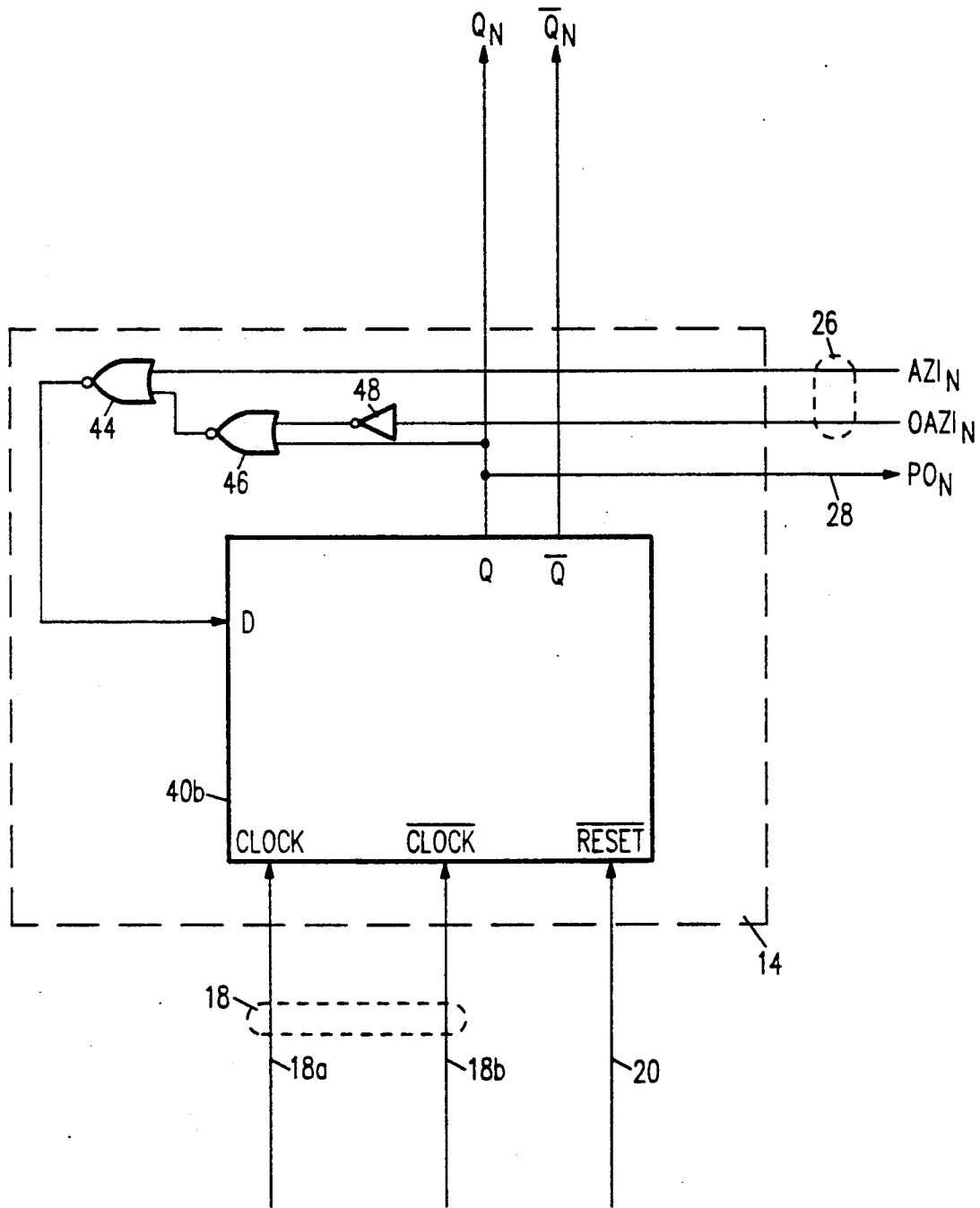

Referring to FIG. 3, the MSB counter stage 14 comprises a D-type flip-flop 40b, two NOR gates 44, 46 and an inverter 48, connected as shown. In a preferred embodiment of the MSB stage 14 of a Gray Code counter 10 in accordance with the present invention, the D-type flip-flop 40b is a master-slave flip-flop (discussed below with respect to FIG. 5). Therefore, the clock signal 18 comprises an active high portion 18a and active low portion 18b.

The Q and $\overline{Q}$ outputs of the D-type flip-flop 40b provide the most significant bit $Q_N$ and its inverse $\overline{Q}_N$. The Q output, i.e., the most significant bit $Q_N$, provides the output interface signal 28. The output interface signal 28 is a "parity output" signal $PO_N$ indicating the parity of the most significant bit $Q_N$.

The input interface signals 26 comprise an "all zeros input" signal $AZI_N$ and a "one and all zeros input" signal $OAZI_N$. The all zeros input signal $AZI_N$ is active high and indicates whether all of the less significant bits $Q_1$-$Q_{N-1}$ are all logical zeros. The one and all zeros input signal $OAZI_N$ is active low and indicates whether the immediately less significant bit $Q_{N-1}$ is a logical one and all less significant bits $Q_1$-$Q_{N-2}$ are all logical zeros. These input interface signals 26 are logically combined (along with the most significant bit $Q_N$) via the NOR gates 44, 46 and inverter 48 to produce the D-input for the flip-flop 40b.

By using the input interface signals 26 as described above, the MSB stage 14 produces a most significant bit $Q_N$ in accordance with a normal Gray Code count. When all less significant bits $Q_1$-$Q_{N-1}$ are logical zeros, the most significant bit $Q_N$ becomes a logical zero. When the immediately less significant bit $Q_{N-1}$ is a logical one and all less significant bits $Q_1$-$Q_{N-2}$ are all logical zeros, the most significant bit $Q_N$ becomes a logical one. All other logical states of the less significant bits $Q_1$-$Q_{N-1}$ cause the most significant bit $Q_N$ to remain unchanged.

As will be recognized by one of ordinary skill in the art, the active high all zeros input signal $AZI_N$ and active low one and all zeros input signal $OAZI_N$ cannot both be active simultaneously. This mutual exclusivity allows the logic combining these signals 26 to be simplified down to the two NOR gates 44, 46 and inverter 48, as shown.

Figure 4:
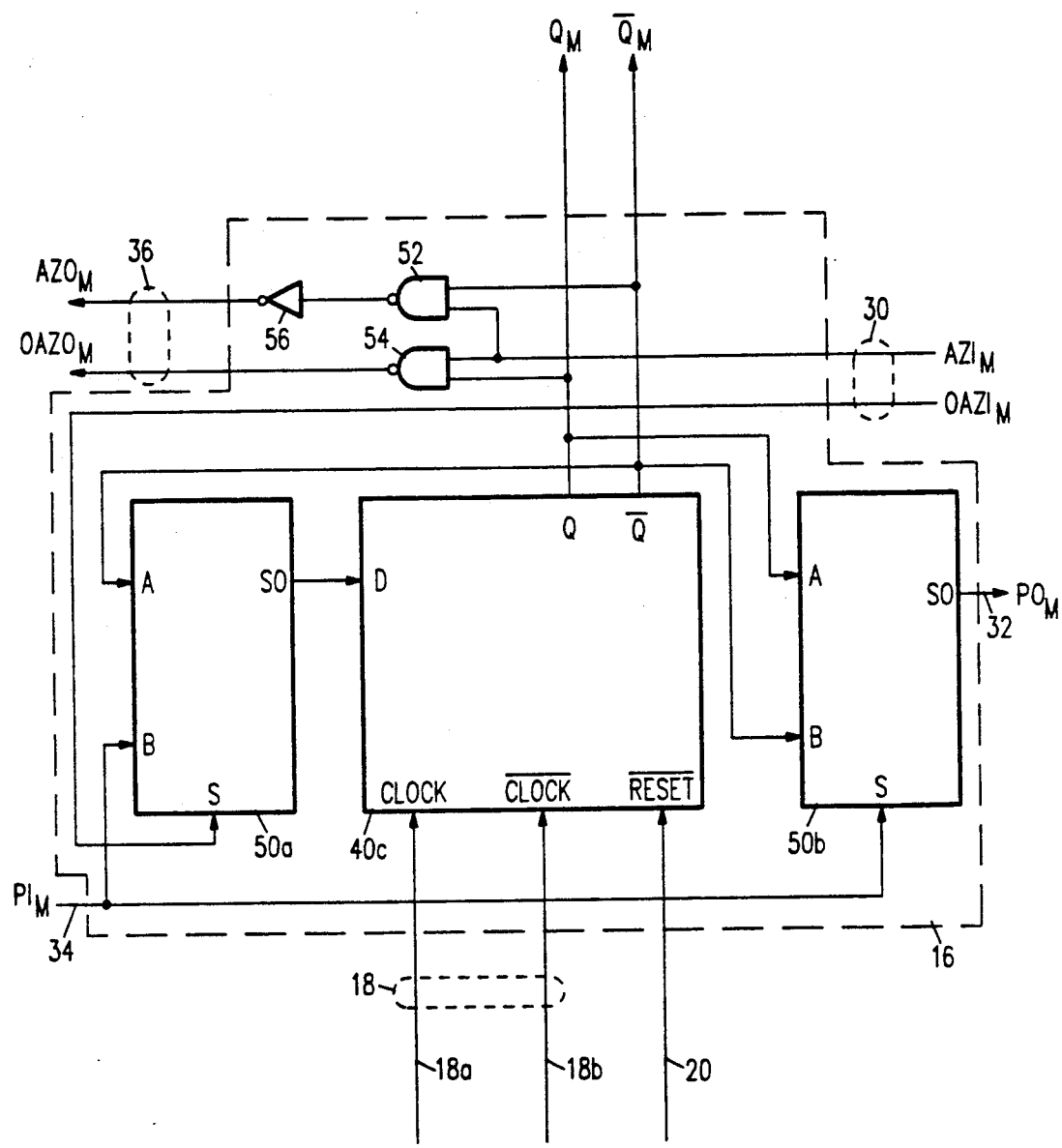

Referring to FIG. 4, the MB stage 16 comprises a D-type flip-flop 40c, two selector circuits 50a, 50b (described more fully below), two NAND gates 52, 54 and an inverter 56, connected as shown. In a preferred embodiment of the MB stage 16 of a Gray Code counter 10 in accordance with the present invention, the D-type flip-flop 40c is a master-slave flip-flop (discussed below with respect to FIG. 5). Therefore, the clock signal 18 comprises an active high portion 18a and an active low portion 18b.

The Q and $\overline{Q}$ outputs of the D-type flip-flop 40c provide the middle bit $Q_N$ and its inverse $\overline{Q}_M$. The middle bit $Q_N$ and its inverse $\overline{Q}_M$ comprise the A and B inputs, respectively, to the output selector circuit 50b used for generating the output interface signal 32 provided to the counter stage for the immediately less significant bit $Q_{M-1}$. This output interface signal 32 is a parity output signal $PO_M$ which indicates the parity of the middle bit $Q_M$ and all more significant bits $Q_{M+1}$-$Q_N$.

As described more fully below for the selector circuit 50 of FIG. 6, this parity output signal $PO_M$ is the inverse of its A input signal when its selector control signal S is a logical one, and is the inverse of its B input when its selector control signal S is a logical zero. In other words, the parity output signal $PO_M$ represents the result of the exclusive-OR function of the A input signal (i.e., $Q_M$) and the selector control signal S (i.e., $PI_M$).

Therefore, when the parity input signal $PI_M$ is a logical one, the parity output signal $PO_M$ has the same logical state as the inverse $\overline{Q}_M$ of the middle bit $Q_M$. When the parity input signal $PI_M$ is a logical zero, the parity output signal $PO_M$ has the same logical state as the middle bit $Q_M$. Thus, the logic state of the parity output signal $PO_M$, which represents the parity of the middle bit $Q_M$ and all more significant bits $Q_{M+1}$-$Q_N$, is set appropriately in accordance with the logic state of the middle bit $Q_M$ and the parity of all more significant bits $Q_{M+1}$-$Q_N$, as represented by the parity input signal $PI_M$.

The middle bit $Q_M$ and its inverse $\overline{Q}_M$ are further combined with one of the input interface signals 30, namely the all zeros input signal $AZI_M$. These signals $Q_M$, $\overline{Q}_M$, $AZI_M$ are logically combined via the NAND gates 52, 54 and inverter 56 to provide the output interface signals 36. These output interface signals 36 comprise an all zeros output signal $AZC_M$ and a one and all zeros output signal $OAZC_M$. The all zeros output signal $AZO_M$ indicates whether the middle bit $Q_M$ and all less significant bits $Q_1$-$Q_{M-1}$ are all logical zeros. The one and all zeros output signal $OAZC_M$ indicates whether the immediately less significant bit $Q_{M-1}$ is a logical one and all less significant bits $Q_1$-$Q_{M-2}$ are all logical zeros.

Referring back to FIG. 1, in accordance with the above discussion, the output interface signals 36 ($AZO_M$, $OAZO_M$) comprise the input interface signals 26 ($AZI_N$, $OAZI_N$) for the MSB stage 14 or the input interface signals 30 ($AZI_M$, $OAZI_M$) for another MB stage, depending upon the bit position of this particular MB stage 16. Similarly, the input interface signals 30 ($AZI_M$, $OAZI_M$) comprise the output interface signals 24 ($AZO_1$, $OAZO_1$) of the LSB stage 12 or the output interface signals 36 ($AZO_M$, $OAZC_M$) of another MB stage, depending upon the bit position of this particular MB stage 16.

Further, the parity input signal 34 ($PI_M$) comprises the parity output signal 28 ($PO_N$) of the MSB stage 14 or the parity output signal 32 ($PO_M$) of another MB stage, depending upon the bit position of this particular MB stage 16. Similarly, the parity output signal 32 ($PO_M$) comprises the parity input signal 22 ($PI_1$) of the LSB stage 12 or the parity input signal 34 ($PI_M$) of another MB stage, depending upon the bit position of this particular MB stage 16

The modular design of the MB stage 16, as well as the LSB 12 and MSB 14 stages, along with their respective interface signals 22, 24, 26, 28, 30, 32, 34, 36, can support the use of "lookahead" logic. The use of lookahead logic may be desirable if a long count sequence is to be used with a high clock 18 rate. A lookahead logic design will generally be unique to each application. Therefore, the design of such logic, in accordance with design techniques known in the art, will generally be done individually for each application.

Referring again to FIG. 4, the D-input of the flip-flop 40c is selected in accordance with the one and all zeros input signal $OAZI_M$. The A and B inputs of the input selector circuit 50a are provided by the inverse $\overline{Q}_M$ of the MB stage 16 and the parity input signal $PI_M$, respectively. As described more fully below, if the selector control signal S of the input selector circuit 50a is a logical one, the output signal SO of the selector circuit 50a, and therefore the D-input of the flip-flop 40c, is the inverse $\overline{A}$ of the A input. If the selector control signal S is a logical zero, the output signal SO of the selector circuit 50a is the inverse $\overline{B}$ of the B input. Therefore, if the one and all zeros input signal $OAZI_M$ is inactive (i.e., a logical one) the D input to the flip-flop 40c is the same logical state as the middle bit $Q_M$. If the one and all zeros input signal $OAZI_M$ is active (i.e., a logical zero), the D input to the flip-flop 40c is the inverse $\overline{PI}_M$ of the parity input signal $PI_M$.

Thus, in accordance with the foregoing discussion, the LSB stage 12 outputs a least significant bit $Q_1$ making the parity odd for itself and all more significant bits $Q_2-Q_N$. The MSB stage 14 outputs a most significant bit $Q_N$ having a logical zero state when all less significant bits $Q_1-Q_{N-1}$ are logical zeros, and having a logical one state when the immediately less significant bit $Q_{N-1}$ is a logical one and all remaining less significant bits $Q_1-Q_{N-2}$ are logical zeros. For all other logical states of less significant bits $Q_1-Q_{N-1}$ the most significant bit $Q_N$ remains unchanged.

The MB stage 16 outputs a middle bit $Q_M$ making the parity odd for itself and all more significant bits $Q_{M+1}-Q_N$ when the immediately less significant bit $Q_{M-1}$ is a logical one and all remaining less significant bits $Q_1-Q_{M-2}$ are logical zeros. For all other logical states of the less significant bits $Q_1-Q_{M-1}$ the middle bit $Q_M$ remains unchanged.

Figure 5:
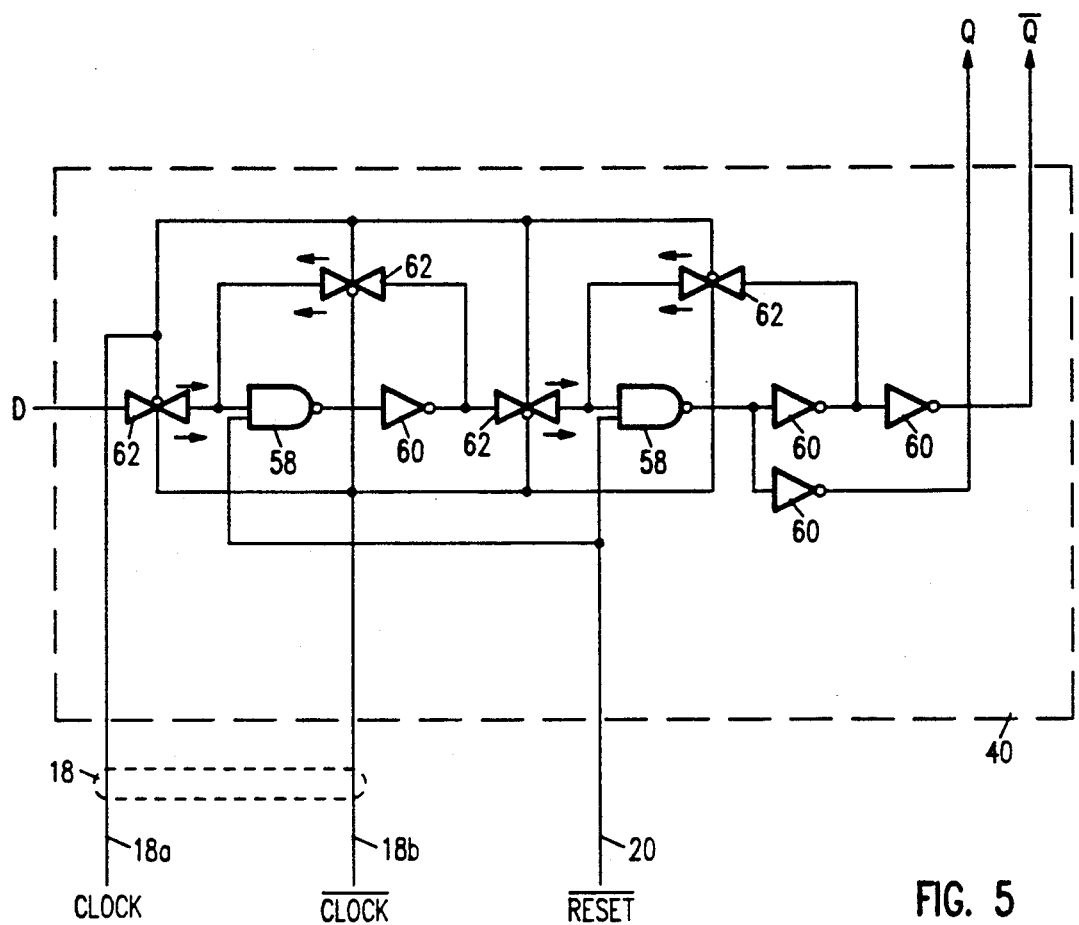

Referring to FIG. 5, a D-type, master-slave flip-flop 40 used in a Gray Code counter 10 in accordance with the present invention is illustrated Interconnection of the NAND gates 58, inverters 60 and pass gates 62, and application of the biphase clock signals 18a, 18b, all as illustrated, produce a D-type, master-slave flip-flop 40.

As will be understood by one of ordinary skill in the art, other circuit configurations for a D-type, master-slave flip-flop 40 are possible. For example, rather than using inverters 60 and pass gates 62 as shown, a more conventional design using cross-coupled NAND gates (not shown) can be employed.

Figure 6:
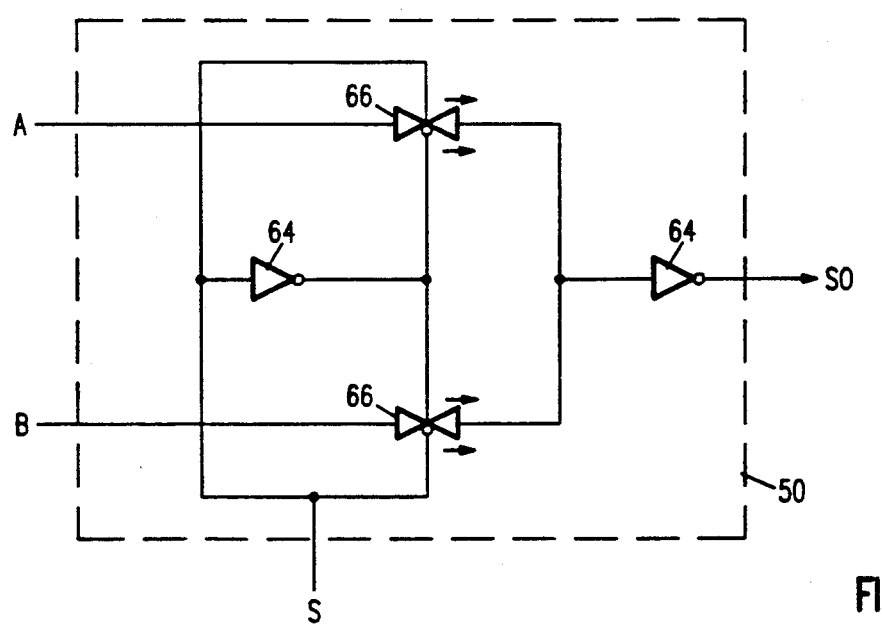

Referring to FIG. 6, a selector circuit 50 used in a Gray Code counter 10 in accordance with the present invention is illustrated. The selector circuit 50 comprises inverters 64 and pass gates 66, connected as shown. When the selector control signal S is a logical one, the output signal SO is the inverse $\overline{A}$ of the A input. If the selector control signal S is a logical zero, the output SO is the inverse $\overline{B}$ of the B input. If the B input is equal to the inverse $\overline{A}$ of the A input signal, the output SO represents the result of the exclusive-OR function ("XOR") of the control signal S and the A input.

As will be understood by one of ordinary skill in the art, other circuit configurations can be used to implement the signal selecting function of the selector circuit 50. For example, a dual input multiplexor can be used with an inverter for its output (not shown).

Figure 7:
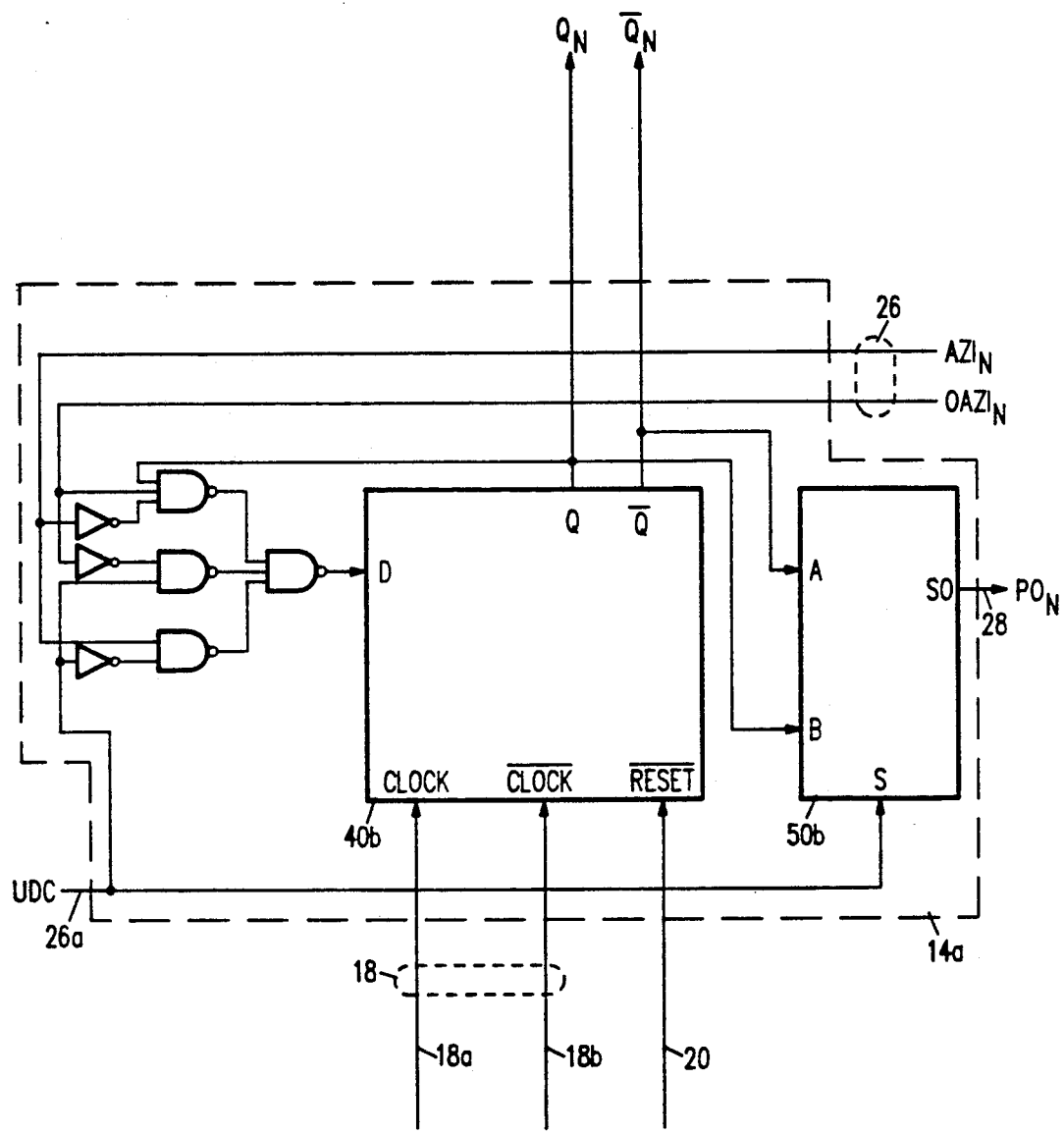

Referring to FIG. 7, an alternative preferred embodiment for a MSB stage 14a of a Gray Code counter 10 in accordance with the present invention is illustrated. As described above, a flip-flop 40b and output selector circuit 50b are used to provide the most significant bit $Q_N$ and parity output signal $PO_N$, respectively, in conjunction with the all zeros input signal $AZI_N$ and one and all zeros input signal $OAZI_N$.

However, an additional input interface signal 26a is provided. This additional input interface signal 26a comprises an up/down control signal UDC used to control the direction of the count sequence for the Gray Code counter 10. When the up/down control signal UDC is a logical one, the operation of the output selector circuit 50b (as described above) causes the parity output signal $PO_M$ to have the logical state of the most significant bit $Q_N$. Therefore, the Gray Code counter 10 counts up, i.e., increments, in accordance with the foregoing discussion.

If the up/down control signal UDC is a logical zero, the operation of the output selector circuit 50b causes the parity output signal $PO_N$ to have the logical state of the inverse $\overline{Q}_N$ of the most significant bit $Q_N$. Furthermore, the D input to the flip-flop 40b, while still dependent upon the all zeros input signal $AZI_N$, the one and all zeros input signal $OAZI_N$, and the most significant bit $Q_N$ itself, is now also dependent upon the up/down control signal UDC.

Thus, by using a reconfigured MSB stage 14a and a single control signal 26a (UDC), a Gray Code counter 10 in accordance with the present invention can be selectively programmed to count up or down, i.e., increment or decrement.

Furthermore, as described above, the LSB stage 12, MSB stage 14 and MB stage 16 are fully modular. The number N of bits appearing in the Gray Code count sequence can be selectively increased or decreased by merely adding or removing MB stages 16, respectively. Moreover, regardless of the number of counter stages 12, 14, 16 used, the counter 10 remains fully synchronous since the clock signal 18 is received directly by every counter stage 12, 14, 16.

It should be understood that various alternatives to the embodiments of the present invention described herein can be employed in practicing the present invention. It is intended that the following claims define the scope of the present invention and that structures and methods (e.g., functionally equivalent Boolean-based designs) within the scope of these claims and their equivalents be covered thereby.

What is claimed is:

1. A bit-wise, synchronous modular N-stage Gray Code counter producing an N-bit count signal having output count bits $Q_1-Q_N$, said counter comprising:
   an LSB circuit coupled to generate a least significant bit $Q_1$ having a lowest bit weight for said counter with respect to more significant bits $Q_2-Q_N$;
   an MSB circuit coupled to generate a most significant bit $Q_N$ having a highest bit weight for said counter with respect to less significant bits $Q_1-Q_{N-1}$; and
   an MB circuit of bit-wise modular design coupled to and between said LSB and MSB circuits to generate a single middle bit $Q_M$ having an intermediate bit weight between said lowest and said highest bit weights, wherein $1<M<N$;
   wherein said LSB, MSB and MB circuits are each coupled to receive a clock signal and to synchronously generate said least significant bit $Q_1$, said most significant bit $Q_N$ and said middle bit $Q_M$, respectively, in accordance with said received clock signal.

2. A Gray Code counter as recited in claim 1, wherein said LSB circuit is coupled to receive a clock signal C and to receive a parity input signal $PI_1$ from said MB circuit representing parity of bits $Q_2$-$Q_N$, and further wherein said LSB circuit is coupled to provide said least significant bit $Q_1$ and its inverse $\overline{Q}_1$, and to provide an all zeros output signal $AZO_1$ and a one and all zeros output signal $OAZO_1$ to said MB circuit, said all zeros output signal $AZO_1$ and said one and all zeros output signal $OAZO_1$ each comprising said inverse $\overline{Q}_1$ of said least significant bit $Q_1$.

3. A Gray Code counter as recited in claim 1, wherein said MSB circuit is coupled to receive a clock signal C, an all zeros input signal $AZI_N$ from said MB circuit representing whether all of bits $Q_1$-$Q_{N-1}$ are logical zeros, and a one and all zeros input signal $OAZI_N$ from said MB circuit representing whether bit $Q_{N-1}$ is a logical one and all of bits $Q_1$-$Q_{N-2}$ are logical zeros, and further wherein said MSB circuit is coupled to provide a parity output signal $PO_N$ to said MB circuit, said parity output signal $PO_N$ comprising said most significant bit $Q_N$.

4. A Gray Code counter as recited in claim 1, wherein said MB circuit is coupled to receive a clock signal C, a parity input signal $PI_M$ from said MSB circuit representing parity of bits $Q_{M+1}$-$Q_N$, an all zeros input signal $AZI_M$ from said LSB circuit representing whether all of bits $Q_1$-$Q_{M-1}$ are logical zeros, and a one and all zeros input signal $OAZI_M$ from said LSB circuit representing whether bit $Q_{M-1}$ is a logical one and all of bits $Q_1$-$Q_{M-2}$ are logical zeros, and further wherein said MB circuit is coupled to provide a middle bit $Q_M$ and its inverse $\overline{Q}_M$, a parity output signal $PO_M$ to said LSB circuit representing parity of bits $Q_M$-$Q_N$, an all zeros output signal $AZO_M$ to said MSB circuit representing whether all of bits $Q_1$-$Q_M$ are logical zeros, and a one and all zeros output signal $OAZO_M$ to said MSB circuit representing whether said middle bit $Q_M$ is a logical one and all of bits $Q_1$-$Q_{M-1}$ are logical zeros.

5. A Gray Code counter as recited in claim 2, wherein said LSB circuit comprises a flip-flop having an input and an output coupled to provide said least significant bit inverse $\overline{Q}_1$, and further comprises an inverter having an input and an output, said inverter output being coupled to said flip-flop input and said inverter output being coupled to receive said parity input signal $PI_1$.

6. A Gray Code counter as recited in claim 5, wherein said LSB circuit flip-flop comprises a D-type, master-slave flip-flop having a D input and a Q output, wherein said D input comprises said flip-flop input and said Q output comprises said flip-flop output.

7. A Gray Code counter as recited in claim 3, wherein said MSB circuit comprises a flip-flop having an input and an output coupled to provide said most significant bit $Q_N$, and further comprises a logic circuit coupled to receive said most significant bit: $Q_N$, said all zeros input signal $AZI_N$, and said one and all zeros input signal $OAZI_N$, and further coupled to provide to said flip-flop input a logical zero if bits $Q_1$-$Q_{N-1}$ are all logical zeros and to provide to said flip-flop input a logical one if bit $Q_{N-1}$ is a logical one and bits $Q_1$-$Q_{N-2}$ are all logical zeros.

8. A Gray Code counter as recited in claim 7, wherein said MSB circuit flip-flop comprises a D-type, master-slave flip-flop having a D input and a Q output, wherein said D input comprises said flip-flop input and said Q output comprises said flip-flop output.

9. A Gray Code counter as recited in claim 4, wherein said MB circuit comprises:

a flip-flop having an input and an output coupled to provide said middle bit $Q_M$ and said middle bit inverse $\overline{Q}_M$;

an output selector coupled to receive said middle bit $Q_M$ and said middle bit inverse $\overline{Q}_M$ and to provide said middle bit $Q_M$ or its inverse $\overline{Q}_M$ as said parity output signal $PO_M$ in accordance with said parity input signal $PI_M$;

an input selector coupled to receive said middle bit inverse $\overline{Q}_M$ or said parity input signal $PI_M$ to said flip-flop input in accordance with said one and all zeros input signal $OAZI_M$; and a logic circuit coupled to provide said all zeros output signal $AZO_M$ and said one and all zeros output signal $OAZO_M$ in accordance with said middle bit $Q_M$, said middle bit inverse $\overline{Q}_M$, said all zeros input signal $AZI_M$ and said one and all zeros input signal $OAZI_M$.

10. A Gray Code counter as recited in claim 9, wherein said MB circuit flip-flop comprises a D-type, master-slave flip-flop having a D input and a Q output, wherein said D input comprises said flip-flop input and said Q output comprises said flip-flop output.

11. A Gray Code counter as recited in claim 1 further comprising a plurality of MB circuits of substantially identical, bit-wise modular design coupled to and between said LSB and MSB circuits to generate a plurality of middle bits $Q_2$-$Q_{N-1}$, wherein each one of said plurality of MB circuits generates one of said plurality of middle bits $Q_2$-$Q_{N-1}$ synchronously with said generated least significant bit $Q_1$ and said generated most significant bit $Q_N$, and further wherein said LSB circuit and said plurality of MB circuits through said MSB circuit comprise more significant bit circuits for generating successively more significant bits, and said MSB circuit and said plurality of MB circuits through said LSB circuit comprise less significant bit circuits for generating successively less significant bits.

12. A Gray Code counter as recited in claim 11, wherein said LSB circuit is coupled to receive a clock signal C and to receive a parity input signal $PI_1$ from a first one of said plurality of MB circuits representing parity of bits $Q_2$-$Q_N$, and further wherein said LSB circuit is coupled to provide said least significant bit $Q_1$ and it inverse $\overline{Q}_1$, and to provide an all zeros output signal $AZO_1$ and a one and all zeros output signal $OAZO_1$ to said first MB circuit, said all zeros output signal $AZO_1$ and said one and all zeros output signal $OAZO_1$ each comprising said inverse $\overline{Q}_1$ of said least significant bit $Q_1$.

13. A Gray Code counter as recited in claim 11, wherein said MSB circuit is coupled to receive a clock signal C, an all zeros input signal $AZI_N$ from a second one of said plurality of MB circuits representing whether all of bits $Q_1$-$Q_{N-1}$ are logical zeros, and a one and all zeros input signal $OAZI_N$ from said second MB circuit representing whether bit $Q_{N-1}$ is a logical one and all of bits $Q_1$-$Q_{N-2}$ are logical zeros, and further wherein said MSB circuit is coupled to provide a parity output signal $PO_N$ to said second MB circuit, said parity output signal $PO_N$ comprising said most significant bit $Q_N$.

14. A Gray Code counter as recited in claim 11, wherein each one of said plurality of MB circuits is coupled to receive a clock signal C, a parity input signal $PI_N$ from one of said more significant bit circuits representing parity of bits $Q_{M+1}$-$Q_N$, an all zeros input signal $AZI_M$ from one of less significant bit circuits representing whether all of bits $Q_1$–$Q_{M-1}$ are logical zeros, and a one and all zeros input signal $OAZI_M$ from said less significant bit circuit representing whether bit $Q_{M-1}$ is a logical one and all of bits $Q_1$–$Q_{M-2}$ are logical zeros, and further wherein each one of said plurality of MB circuits is coupled to provided a middle bit $Q_M$ and its inverse $\overline{Q}_M$, a parity output signal $PO_M$ to said less significant bit circuit representing parity of bits $Q_M$–$Q_N$, an all zeros output signal $AZO_M$ to said more significant bit circuit representing whether all of bits $Q_1$–$Q_M$ are logical zeros, and a one and all zeros output signal $OAZO_M$ to said more significant bit circuit representing whether bit $Q_M$ is a logical one and all of bits $Q_1$–$Q_{M-1}$ are logical zeros.

15. A Gray Code counter as recited in claim 12, wherein said LSB circuit comprises a flip-flop having an input and an output coupled to provide said least significant bit inverse $\overline{Q}_1$, and further comprises an inverter having an input and an output, said inverter output being coupled to said flip-flop input and said inverter input being coupled to receive said parity input signal $PI_1$.

16. A Gray Code counter as recited in claim 15, wherein said LSB circuit flip-flop comprises a D-type, master-slave flip-flop having a D input and a Q output, wherein said D input comprises said flip-flop input and said Q output comprises said flip-flop output.

17. A Gray Code counter as recited in claim 13, wherein said MSB circuit comprises a flip-flop having an input and an output coupled to provide said most significant bit $Q_N$, and further comprises a logic circuit coupled to receive said most significant bit $Q_N$, said all zeros input signal $AZI_N$, and said one and all zeros input signal $OAZI_N$, and further coupled to provide to said flip-flop input a logical zero when bits $Q_1$–$Q_{N-1}$ are all logical zeros and to provide to said flip-flop input a logical one when bit $Q_{N-1}$ is a logical one and bits $Q_1$–$Q_{N-2}$ are all logical zeros.

18. A Gray Code counter as recited in claim 17, wherein said MSB circuit flip-flop comprises a D-type master-slave flip-flop having a D input and a Q output, wherein said D input comprises said flip-flop input and said Q output comprises said flip-flop output.

19. A Gray Code counter as recited in claim 14, wherein each one of said plurality of MB circuits comprises:
   a flip-flop having an input and an output coupled to provide said middle bit $Q_M$ and its inverse $\overline{Q}_M$;
   an output selector coupled to receive said middle bit $Q_M$ and its inverse $\overline{Q}_M$ and to provide said middle bit $Q_M$ or its inverse $\overline{Q}_M$ as said parity output signal $PO_M$ in accordance with said parity input signal $PI_M$;
   an input selector coupled to receive said middle bit inverse $\overline{Q}_M$ or said parity input signal $PI_N$ to said flip-flop input in accordance with said one and all zeros input signal $OAZI_M$; and
   a logic circuit coupled to provide said all zeros output signal $AZO_M$ and said one and all zeros output signal $OAZO_M$ in accordance with said middle bit $Q_M$, its inverse $\overline{Q}_M$, said all zeros input signal $AZI_M$ and said one and all zeros input signal $OAZI_M$.

20. A Gray Code counter as recited in claim 19, wherein said MB circuit flip-flop comprises a D-type, master-slave flip-flop having a D input and a Q output, wherein said D input comprises said flip-flop input and said Q output comprises said flip-flop output.

21. A bit-wise, synchronous modular N-stage Gray Code up/down counter producing an N-bit up/down count signal having output count bits $Q_1$–$Q_N$, said up/down counter comprising:
   an LSB circuit coupled to generate a least significant bit $Q_1$ having a lowest bit weight for said counter with respect to more significant bits $Q_2$–$Q_N$;
   an MSB circuit coupled to generate a most significant bit $Q_N$ having a highest bit weight for said counter with respect to less significant bits $Q_1$–$Q_{N-1}$; said MSB circuit being further coupled to selectively cause said counter to count up or down; and
   a plurality of MB circuits of substantially identical, bit-wise modular design coupled to and between said LSB and MSB circuits to generate a plurality of middle bits $Q_2$–$Q_{M-1}$ having intermediate bit weights between said lowest and said highest bit weights, wherein $1<M<N$ and each one of said plurality of MB circuits generates one of said plurality of middle bits $Q_2$–$Q_{M-1}$ synchronously with said generated least significant bit $Q_1$ and said generated most significant bit $Q_M$, and further wherein said LSB circuit and said plurality of MB circuits through said MSB circuit comprise more significant bit circuits for generating successively more significant bits, and said MSB circuit and said plurality of MB circuits through said LSB circuit comprise less significant bit circuits for generating successively less significant bits.

22. A Gray Code counter as recited in claim 21, wherein said LSB circuit is coupled to receive a clock signal C and to receive a parity input signal $PI_1$ from a first one of said plurality of MB circuits representing parity of bits $Q_2$–$Q_N$, and further wherein said LSB circuit is coupled to provide said least significant bit $Q_1$ and its inverse $\overline{Q}_1$, and to provide an all zeros output signal $AZO_1$ and a one and all zeros output signal $OAZO_1$ to said first MB circuit, said all zeros output signal $AZO_1$ and said one and all zeros output signal $OAZO_1$ each comprising said inverse $\overline{Q}_1$ of said least significant bit $Q_1$.

23. A Gray Code counter as recited in claim 11, wherein said MSB circuit is coupled to receive a clock signal C, an up/down count control signal UDC, an all zeros input signal $AZI_N$ from a second one of said plurality of MB circuits representing whether all of bits $Q_1$–$Q_{N-1}$ are logical zeros, and a one and all zeros input signal $OAZI_N$ from said second MB circuit representing whether bit $Q_{N-1}$ is a logical one and all of bits $Q_1$–$Q_{N-2}$ are logical zeros, and further wherein said MSB circuit is coupled to provide a parity output signal $PO_N$ to said second MB circuit, said parity output signal $PO_N$ comprising said most significant bit $Q_N$ or its inverse $\overline{Q}_N$ in accordance with said up/down count control signal UDC.

24. A Gray Code counter as recited in claim 23, wherein each one of said plurality of MB circuits is coupled to receive a clock signal C, a parity input signal $PI_M$ from one of said more significant bit circuits representing parity of bits $Q_{M+1}$–$Q_N$, an all zeros input signal $AZI_M$ from one of said less significant bit circuits representing whether all of bits $Q_1$–$Q_{M-1}$ are logical zeros, and a one and all zeros input signal $OAZI_M$ from said less significant bit circuit representing whether bit $Q_{M-1}$ is a logical one and all of bits $Q_1$–$Q_{M-2}$ are logical zeros, and further wherein each one of said plurality of MB circuits is coupled to provide a middle bit $Q_M$ and its inverse $\overline{Q}_M$, a parity output signal $PO_M$ to said less significant bit circuit representing parity of bits $Q_M-Q_N$, an all zeros output signal $AZO_M$ to said more significant bit circuit representing whether all of bits $Q_1-Q_M$ are logical zeros, and a one and all zeros output signal $OAZO_M$ to said more significant bit circuit representing whether bit $Q_M$ is a logical one and all of bits $Q_1-Q_{M-1}$ are logical zeros.

25. A Gray Code counter as recited in claim 24, wherein said LSB circuit comprises a D-type, master-slave flip-flop having a D input and a Q output coupled to provide said least significant bit inverse $\overline{Q}_1$, and further comprising an inverter having an input and an output, said inverter output being coupled to said D input and said inverter input being coupled to receive said parity input signal $PI_1$.

26. A Gray Code counter as recited in claim 25, wherein said MSB circuit comprises a D-type, master-slave flip-flop having a D input and a Q output coupled to provide said most significant bit $Q_N$, and further comprises a D input selector circuit coupled to receive said most significant bit $Q_N$, said all zeros input signal $AZI_N$, and said one and all zeros input signal $OAZI_N$, and further coupled to provide to said D input a logical zero when bits $Q_1-Q_{N-1}$ are all logical zeros and to provide to said D input a logical one when bit $Q_{N-1}$ is a logical one and bits $Q_1-Q_{N-2}$ are all logical zeros, or vice versa in accordance with said up/down count control signal UDC.

27. A Gray Code counter as recited in claim 26, wherein each one of said plurality of MB circuits comprises:
 a D-type, master-slave flip-flop having a D input and a Q output coupled to provide said middle bit $Q_N$ and its inverse $\overline{Q}_M$;
 an output selector coupled to receive said middle bit $Q_M$ and its inverse $\overline{Q}_M$ and to provide said middle bit $Q_M$ or its inverse $\overline{Q}_M$ as said parity output signal $PO_M$ in accordance with said parity input signal $PI_M$;
 an input selector coupled to receive said middle bit inverse $\overline{Q}_M$ or said parity input signal $PI_M$ to said D input in accordance with said one and all zeros input signal $OAZI_M$; and
 a logic circuit coupled to provide said all zeros output signal $AZO_M$ and said one and all zeros output signal $OAZO_M$ in accordance with said middle bit $Q_M$, its inverse $\overline{Q}_M$, said all zeros input signal $AZI_M$ and said one and all zeros input signal $OAZI_M$.

28. A method for generating a bit-wise, synchronous Gray Code count sequence having N bits $Q_1-Q_N$ comprising a least significant bit $Q_1$, a most significant bit $Q_N$ and at least one middle bit $Q_M$, where $1<M<N$, said method comprising the steps of:
 generating a least significant bit $Q_1$ utilizing an LSB circuit;
 generating a most significant bit $Q_N$ synchronously with said generated least significant bit $Q_1$ utilizing an MSB circuit; and
 generating at least one middle bit $Q_M$ utilizing at least one MB circuit of bit-wise modular design coupled to and between said LSB and MSB circuits, wherein an MB circuit is used to generate a middle bit $Q_M$ synchronously with said generated least significant bit $Q_1$ and said generated most significant bit $Q_N$.

29. A method as recited in claim 28, wherein said step of generating a least significant bit $Q_1$ comprises the step of coupling a first parity input signal $PI_1$ to said LSB circuit from said MSB circuit, said first parity input signal $PI_1$ representing parity of bits $Q_2-Q_N$ more significant than said least significant bit $Q_1$.

30. A method as recited in claim 28, wherein said step of generating a most significant bit $Q_N$ comprises the steps of:
 coupling a first bit state input signal $AZI_N$ to said MSB circuit from said MB circuit, said first bit state input signal $AZI_N$ representing whether all less significant bits $Q_1-Q_{N-1}$ are all logical zeros; and
 coupling a second bit state input signal $OAZI_N$ to said MSB circuit from said MB circuit, said second bit state input signal $OAZI_N$ representing whether an immediately less significant bit $Q_{N-1}$ is a logical one and all other less significant bits $Q_1-Q_{N-2}$ are all logical zeros.

31. A method as recited in claim 28, wherein said step of generating synchronously and according to a modular design at least one middle bit $Q_M$ comprises the steps of:
 providing a second parity input signal $PI_M$ to said MB circuit, said second parity input signal $PI_M$ representing parity of all more significant bits $Q_{M+1}-Q_N$;
 providing a third bit state input signal $AZI_M$ to said MB circuit, said third bit state input signal $AZI_M$ representing whether all bits $Q_1-Q_{M-1}$ less significant than said middle bit $Q_M$ are all logical zeros;
 providing a fourth bit state input signal $OAZI_M$ to said MB circuit, said fourth bit state input signal $OAZI_M$ representing whether an immediately less significant bit $Q_{M-1}$ is a logical one and all other less significant bits $Q_1-Q_{M-2}$ are all logical zeros;
 generating a parity output signal $PO_M$ representing parity of said middle bit $Q_M$ and all of said more significant bits $Q_{M+1}-Q_N$;
 generating a first output signal $AZO_M$ representing whether said middle bit $Q_M$ and said less significant bits $Q_1-Q_{M-1}$ are all logical zeros; and
 generating a second output signal $OAZO_M$ representing whether said middle bit $Q_M$ is a logical one and said less significant bits $Q_1-Q_{M-1}$ are all logical zeros.

32. A method for generating a synchronous, Gray Code count sequence having N bits $Q_1-Q_N$ comprising a least significant bit $Q_1$, a most significant bit $Q_N$ and at least one middle bit $Q_N$, where $1<M<N$, said method comprising the steps of:
 generating synchronously a least significant bit $Q_1$, wherein parity is odd for said bit $Q_1$ and all more significant bits $Q_2-Q_N$;
 generating synchronously a most significant bit $Q_N$, wherein said bit $Q_N$ is a logical zero when all less significant bits $Q_1-Q_{N-1}$ are all logical zeros, and wherein said bit $Q_N$ is a logical one when an immediately less significant bit $Q_{N-1}$ is a logical one and all other less significant bits $Q_1-Q_{N-2}$ are all logical zeros; and
 generating synchronously and according to a modular design at least one middle bit $Q_N$, wherein parity is odd for said bit $Q_N$ and all more significant bits $Q_{N-1}-Q_N$ when an immediately less significant bit $Q_{M-1}$ is a logical one and all other less significant bits $Q_1-Q_{M-2}$ are all logical zeros.

33. A method as recited in claim 32, wherein said step of generating synchronously a least significant bit $Q_1$ comprises the step of providing a first parity input signal $PI_1$ representing parity of bits $Q_2$–$Q_N$ more significant than said least significant bit $Q_1$.

34. A method as recited in claim 32, wherein said step of generating synchronously a most significant bit $Q_N$ comprises the steps of:

providing a first bit state input signal $AZI_N$ representing whether said less significant bits $Q_1$–$Q_{N-1}$ are all logical zeros; and providing a second bit state input signal $OAZI_N$ representing whether said immediately less significant bit $Q_{N-1}$ is a logical one and said other less significant bits $Q_1$–$Q_{N-2}$ are all logical zeros.

35. A method as recited in claim 32, wherein said step of generating synchronously and according to a modular design at least one middle bit $Q_M$ comprises the steps of:

providing a second parity input signal $PI_M$ representing parity of all of said more significant bits $Q_{M+1}$–$Q_N$;

providing a third bit state input signal $AZI_M$ representing whether all bits $Q_1$–$Q_{M-1}$ less significant than said middle bit $Q_M$ are all logical zeros;

providing a fourth bit state input signal $OAZI_M$ representing whether said immediately less significant bit $Q_{M-1}$ is a logical one and said other less significant bits $Q_1$–$Q_{M-2}$ are all logical zeros;

generating a parity output signal $PO_M$ representing said parity of said middle bit $Q_M$ and all of said more significant bits $Q_{M+1}$–$Q_N$;

generating a first output signal $AZO_M$ representing whether said middle bit $Q_M$ and said less significant bits $Q_1$–$Q_{M-1}$ are all logical zeros; and generating a second output signal $OAZO_M$ representing whether said middle bit $Q_M$ is a logical one and said less significant bits $Q_1$–$Q_{M-1}$ are all logical zeros.

* * * * *